US011217498B2

(12) United States Patent
Fang et al.

(10) Patent No.: US 11,217,498 B2
(45) Date of Patent: Jan. 4, 2022

(54) SEMICONDUCTOR PACKAGE AND MANUFACTURING METHOD OF THE SAME

(71) Applicant: Advanced Semiconductor Engineering, Inc., Kaohsiung (TW)

(72) Inventors: Hsu-Nan Fang, Kaohsiung (TW); Chien-Ching Chen, Kaohsiung (TW); Chen Yuan Weng, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/671,988

(22) Filed: Nov. 1, 2019

(65) Prior Publication Data

US 2021/0134692 A1 May 6, 2021

(51) Int. Cl.
H01L 23/31 (2006.01)
H01L 23/29 (2006.01)
H01L 23/00 (2006.01)
H01L 21/56 (2006.01)

(52) U.S. Cl.
CPC ........ H01L 23/3135 (2013.01); H01L 21/561 (2013.01); H01L 21/566 (2013.01); H01L 23/291 (2013.01); H01L 23/295 (2013.01); H01L 23/3114 (2013.01); H01L 24/29 (2013.01); H01L 24/96 (2013.01); H01L 2224/02379 (2013.01)

(58) Field of Classification Search
CPC ............. H01L 24/96; H01L 21/56–568; H01L 2224/023; H01L 2224/02379; H01L 23/28–3192; H01L 23/3135; H01L 23/3142; H01L 23/295; H01L 23/3114; H01L 23/291

See application file for complete search history.

(56) References Cited

U.S. PATENT DOCUMENTS

| 8,610,286 | B2 | 12/2013 | Lin et al. | |
|---|---|---|---|---|
| 9,508,621 | B2 | 11/2016 | Lin et al. | |
| 9,527,723 | B2 | 12/2016 | Lin et al. | |
| 2014/0061944 | A1* | 3/2014 | Lin | H01L 24/19 257/774 |
| 2014/0217597 | A1* | 8/2014 | Lin | H01L 24/97 257/773 |
| 2015/0145126 | A1* | 5/2015 | Lin | H01L 23/16 257/737 |
| 2016/0379935 | A1* | 12/2016 | Shih | H01L 23/49827 257/738 |
| 2018/0061776 | A1* | 3/2018 | Yang | H01L 24/97 |
| 2019/0214288 | A1* | 7/2019 | Fan | H01L 24/96 |
| 2019/0252278 | A1* | 8/2019 | Shen | H01L 23/5385 |

* cited by examiner

Primary Examiner — Errol V Fernandes
Assistant Examiner — Jeremy J Joy
(74) Attorney, Agent, or Firm — Foley & Lardner LLP

(57) ABSTRACT

A semiconductor package includes a semiconductor die having a first surface and a second surface opposite to the first surface, a conductive wiring layer stacked with the semiconductor die and proximal to the first surface, an encapsulant encapsulating the semiconductor die and stacked with the conductive wiring layer, and a replacement structure exposing from the encapsulant and being free of fillers. A method for manufacturing the semiconductor package is also disclosed in the present disclosure.

11 Claims, 21 Drawing Sheets

SEMICONDUCTOR PACKAGE AND MANUFACTURING METHOD OF THE SAME

BACKGROUND

1. Technical Field

The present disclosure relates to a semiconductor package, particularly, to a fan-out package structure.

2. Description of the Related Art

To adapt for the development of mobile communication devices, volume reduction (e.g., thinning), manufacturing cost reduction, function flexibility, and expedited product cycle are important to device packaging.

Grinding is an approach in semiconductor packaging in reducing package thickness. Generally speaking, semiconductor die is disposed over a redistribution layer (RDL), encapsulated with molding compound, grinding the molding compound to thin down package thickness, and followed by die saw or singulation operations. However, such manufacturing sequence possesses following problems: first, grinded package is easily warped due to insufficient structural robustness, when subsequently dices, the warped feature may deteriorate vacuum suction provided by the pedestal, increasing the difficulties of dicing operation. Second, due to the fact that roller blade may raise its rotation speed at the moment completing a full cut, cracks may generate at the adjacent molding compound. For a half-cut operation, roller blade may also likely to crack adjacent molding compound because of inevitable shaking movement during operation.

SUMMARY

In some embodiments, the present disclosure provides a semiconductor package, including a semiconductor die having a first surface and a second surface opposite to the first surface, a conductive wiring layer stacked with the semiconductor die and proximal to the first surface, an encapsulant encapsulating the semiconductor die and stacked with the conductive wiring layer, and a replacement structure exposing from the encapsulant and being free of fillers.

In some embodiments, the present disclosure provides a semiconductor package, including a semiconductor die having a first surface and a second surface opposite to the first surface, a conductive wiring layer stacked with the semiconductor die and proximal to the first surface, an encapsulant encapsulating the semiconductor die and stacked with the conductive wiring layer, the encapsulant having a first modulus, and a replacement structure exposing from the encapsulant and having a second modulus. The second modulus is greater than the first modulus.

In some embodiments, the present disclosure provides method for manufacturing a semiconductor package, the method including providing a first carrier having a first surface, disposing replacement structure over the first surface, and engaging the replacement structure on the first carrier to a second carrier carrying a plurality of semiconductor dies, the replacement structure being aligned with a region separating adjacent semiconductor dies.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 9C' illustrates a top view of the intermediate product in FIG. 9C, according to some embodiments of the present disclosure.

DETAILED DESCRIPTION

Figure 1:
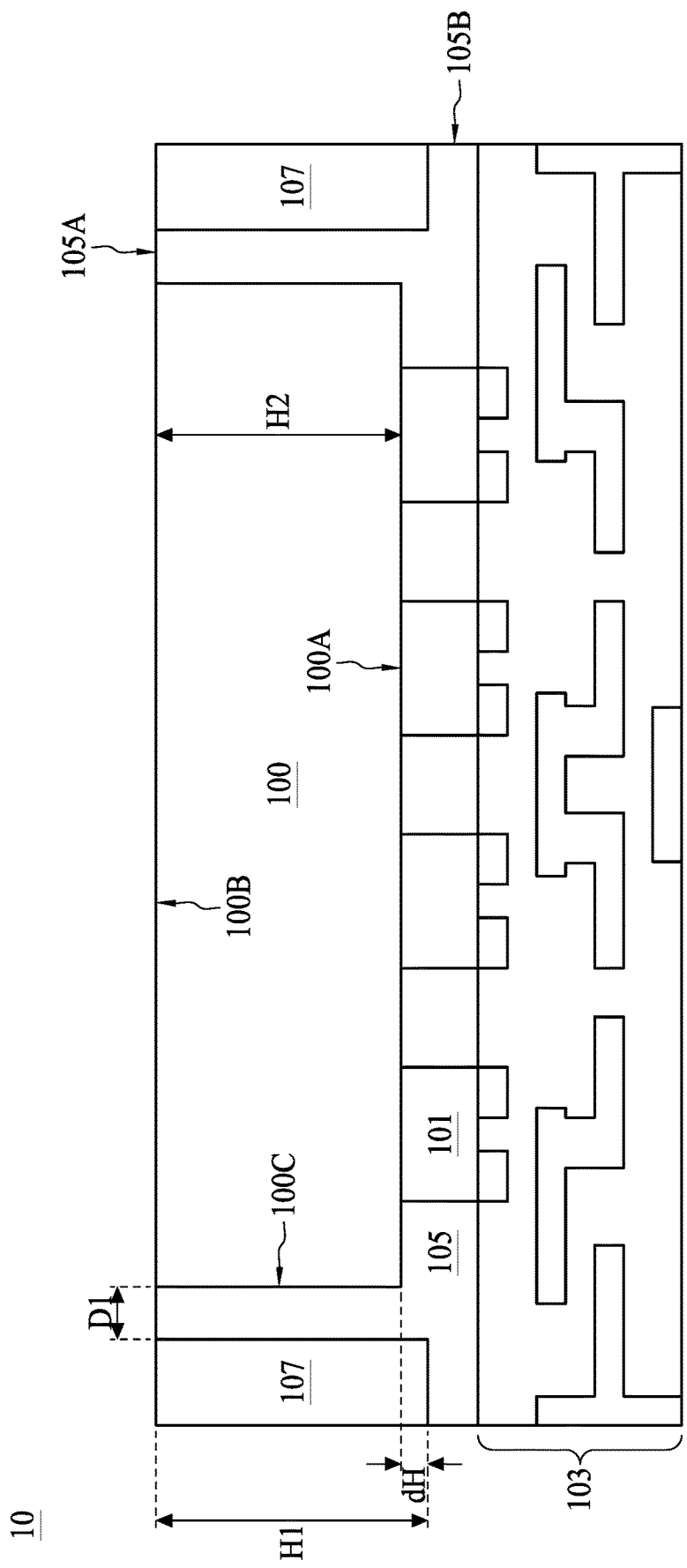
FIG. 1 illustrates a cross-sectional view of a semiconductor package according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Present disclosure provides a fan-out thinned package and manufacturing method of the same. In contrast to comparative embodiments, the package structure of present disclosure is singulated prior to applying grinding operation. When in a panel or matrix form, the semiconductor package structure is half-cut, and then applying grinding operation to reduce package thickness to a desired extent. Such manufacturing sequence effectively solves the warpage caused by lack of structural robustness after grinding, the vacuum suction deterioration when dicing, and the chipping/crack in adjacent molding compound during roller blading.

In some embodiments, the package structure described in the present disclosure includes a replacement structure having a higher modulus than those of the molding compound and the RDL. The replacement structure surrounds the semiconductor die and overlaps with the saw street. The dimension of the replacement structure is adjustable in order to achieve optimal structural balance among molding compound, replacement structure, semiconductor die, and RDL.

Referring to FIG. 1, FIG. 1 illustrates a cross-sectional view of a semiconductor package 10 according to some embodiments of the present disclosure. The semiconductor package 10 includes a semiconductor die 100 having a first surface 100A and a second surface 100B opposite to the first surface 100A. In some embodiments, the first surface 100A is an active surface where a plurality of conductive elements 101 are adjacent to, embedded under and/or partially exposed from the active surface. The conductive elements 101 may include conductive pads, conductive pillar, solder bump, C4 bump, and equivalents thereof. The conductive elements 101 on the first surface are configured to form electrical connection with a conductive wiring layer 103 stacked with the semiconductor die 100. The conductive wiring layer 103 is closer to the first surface 100A than to the second surface 100B of the semiconductor die 100. In some embodiments, the conductive wiring layer 103 is a redistribution layer (RDL) composed of layers of dielectric and conductive lines embedded in the layers of dielectric. In some embodiments, the conductive wiring layer 103 is a fan-our RDL which broaden the areal coverage of conductive elements 101 on the first surface 100A of the semiconductor die 100.

An encapsulant 105 surrounds the semiconductor die 100 and the conductive elements 101, disposed on the conductive wiring layer 103. In some embodiments, the encapsulant 105 is composed of epoxy compound and fillers. In some embodiments, the encapsulant 105 is encapsulation molding compounds (EMCs) used to protect integrated circuit (IC) chips. Their composition contains fillers of a large amount (about 70%) and will affect the properties of the EMCs. In some embodiments, the fillers include oxides, silicon oxides, or silica of various types. A replacement structure 107 is partially encapsulated by the encapsulant 105, surrounding a side surface 100C of the semiconductor die 100, and exposed from the encapsulant 105 on its top and side surfaces. The side surface 100C of the semiconductor die 10 connects the first surface 100A and the second surface 100B of the semiconductor die 10. In some embodiments, unlike the encapsulant 105, the replacement structure 107 is free of any filler as those described above in the encapsulant 105. Referring to FIG. 10A to FIG. 10G of the present disclosure, the replacement structure 107 is integrated to the semiconductor package 10 through a molding operation transferring the replacement structure 107 from another carrier to the space between adjacent semiconductor dies 100. The fillers in the encapsulant 105, especially those adjacent to the replacement structure 107, are complete and not broken. In some comparative embodiments, broken fillers can usually be observed due to removal of a portion of the encapsulant 105 after it is cured. The mechanical removal process can create broken fillers at the removing boundary of the encapsulant 105. Heterogeneous material may subsequently fill the empty space of the encapsulant created by the removal operation. Alternatively stated, broken fillers can be observed at the boundary between the cured encapsulant and the heterogeneous material in the comparative embodiments. In the present disclosure, since the integration of the replacement structure 107 to the semiconductor die 100 is prior to the curing of the encapsulant 105, the fillers in the encapsulant 105, even at the boundary between the cured encapsulant 105 and the replacement structure 107, are complete and not broken.

Figure 5:
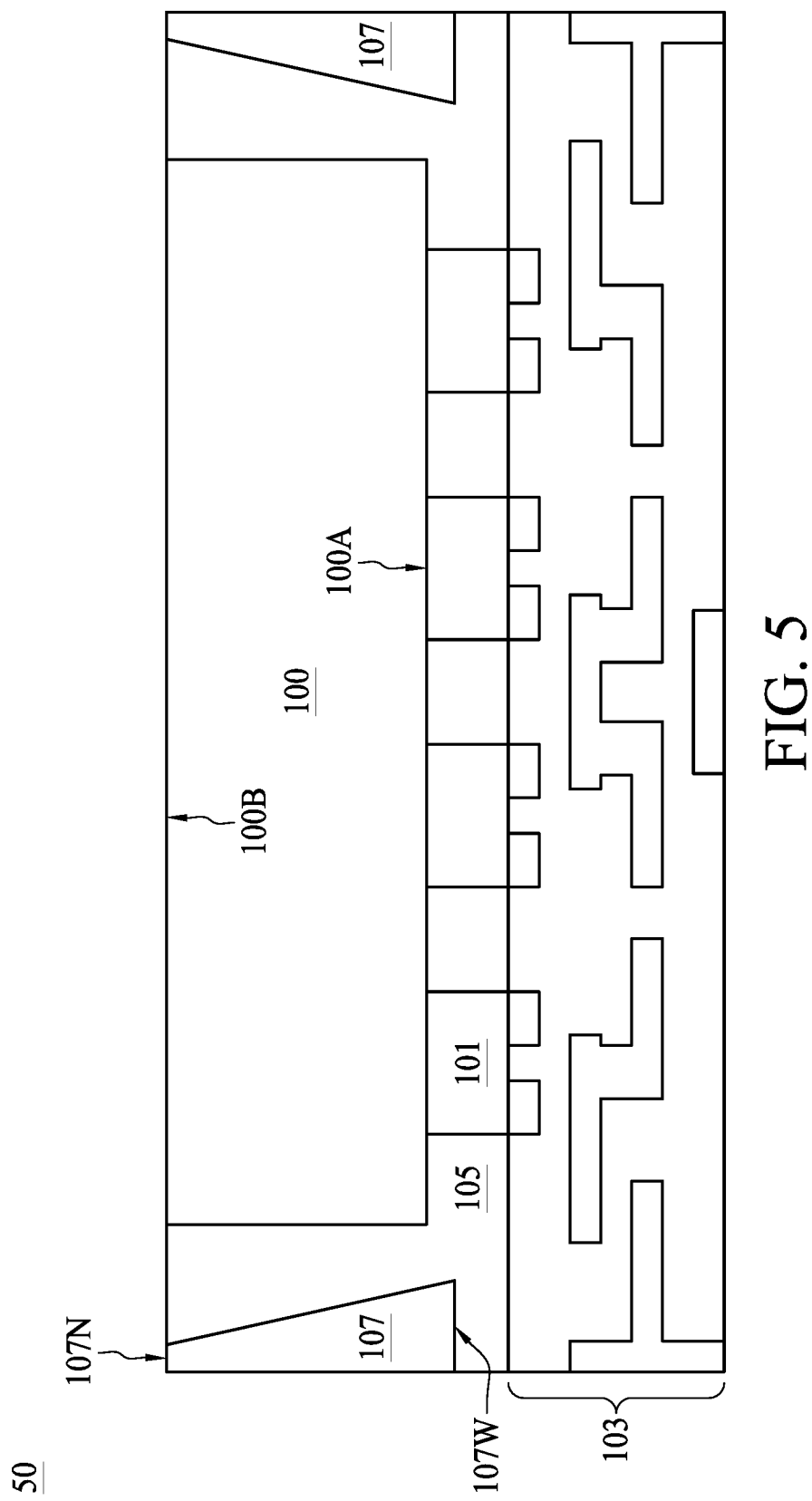
FIG. 5 illustrates a cross-sectional view of a semiconductor package according to some embodiments of the present disclosure.

In some embodiments, Young's modulus (hereinafter modulus) of the replacement structure 107 is greater than modulus of the encapsulant 105. In some embodiments, modulus of the replacement structure 107 is greater than modulus of the conductive wiring layer 103. For example, modulus of the encapsulant 105 may be in a range of from about 20 GPa to 30 GPa, and modulus of the conductive wiring layer 103 may be in a range of about 3-5 Mpa or 1-3 Gpa, depending on whether the environment temperature is lower or higher than glass transition temperature (Tg), respectively. The modulus of the replacement structure 107 may be greater than 50 GPa. In some embodiments, the replacement structure 107 is composed of pre-impregnated composite fiber in epoxy matrix which has a modulus from about 60 GPa to 70 GPa. In some embodiments, the replacement structure 107 may be composed of glass having a modulus from about 70 GPa to 80 GPa. In some embodiments, the replacement structure 107 may be composed of ceramic having a modulus over 300 GPa. In some embodiments, the replacement structure 107 can be pre-formed with desired shape or dimensions, for example, the replacement structure 107 may have a columnar cross section with uniform width as illustrated in FIG. 1, or the replacement structure 107 may have a wider bottom and a narrower top as illustrated in FIG. 5.

As illustrated in FIG. 1, a distance D1 between the side surface 100C of the semiconductor die 100 and the side surface of the replacement structure 107 is in a range of from about 3 μm to about 10 μm. Referring to FIG. 10A to FIG. 10G of the present disclosure, the replacement structure 107 is integrated to the semiconductor package 10 through a molding operation transferring the replacement structure 107 from another carrier to the space between adjacent semiconductor dies 100. The distance D1 between the side surface 100C of the semiconductor die 100 and the side surface of the replacement structure 107 can be modified by applying a wider or narrower replacement structure 107. Determination of the distance D1 may include following factors, modulus of the replacement structure 107, modulus of the encapsulant 105, modulus of the conductive wiring layer 103, and the respective volumes suitable for preventing package warpage after package thinning operation. The distance D1 in present disclosure is determined to be in a range of from about 3 μm to about 10 μm because the processing window of aligning the replacement structure 107 and the semiconductor die 100 on two respective carriers is about 3 and distance D1 greater than 10 μm may deteriorate the production throughput by lowering total number of packages per operation.

As shown in FIG. 1, the second surface 100B, the encapsulant 105, and replacement structure 107 form a coplanar surface as a result of a backside grinding operation, as will be described in FIG. 10L of the present disclosure. The encapsulant 105 exposes from the package at two distinctive locations, the first portion 105A is proximal to the second surface 100B and the second portion 105B s proximal to the conductive wiring layer 103. In some embodiments, surface roughness of the second portion 105B is greater than the surface roughness of the first portion 105A. Referring to FIG. 10J and FIG. 10L of the present disclosure, the first portion 105A is formed by a backside grinding operation, and the second portion 105B is formed by a die-sawing operation. The sawing blade generally generates a rougher surface than a grinder.

As shown in FIG. 1, a thickness or a height H2 of the semiconductor die 100 may be shorter than a height H1 of the replacement structure 107. The height H2 is measured from the first surface 100A to the second surface 100B of the semiconductor die 100. In some embodiments, a height difference dH can be observed in the semiconductor package 10 because when the sawing blade singulating adjacent semiconductor packages 10 from a strip or a panel configuration from the side of conductive wiring layer 103, chipping or cracks can easily formed at the interface of the encapsulant 105 and the replacement structure 107. Keeping such interface at a position away from the first surface 100A of the semiconductor die 100 can reduce the chance of crack propagation toward the active surface of the semiconductor die 100. Therefore, one end of the replacement structure 107 may not be leveled with the first surface 100A of the semiconductor die 100 but extending toward the conductive wiring layer 103 in order to keep the interface away from the active surface of the semiconductor die 100.

Figure 2:
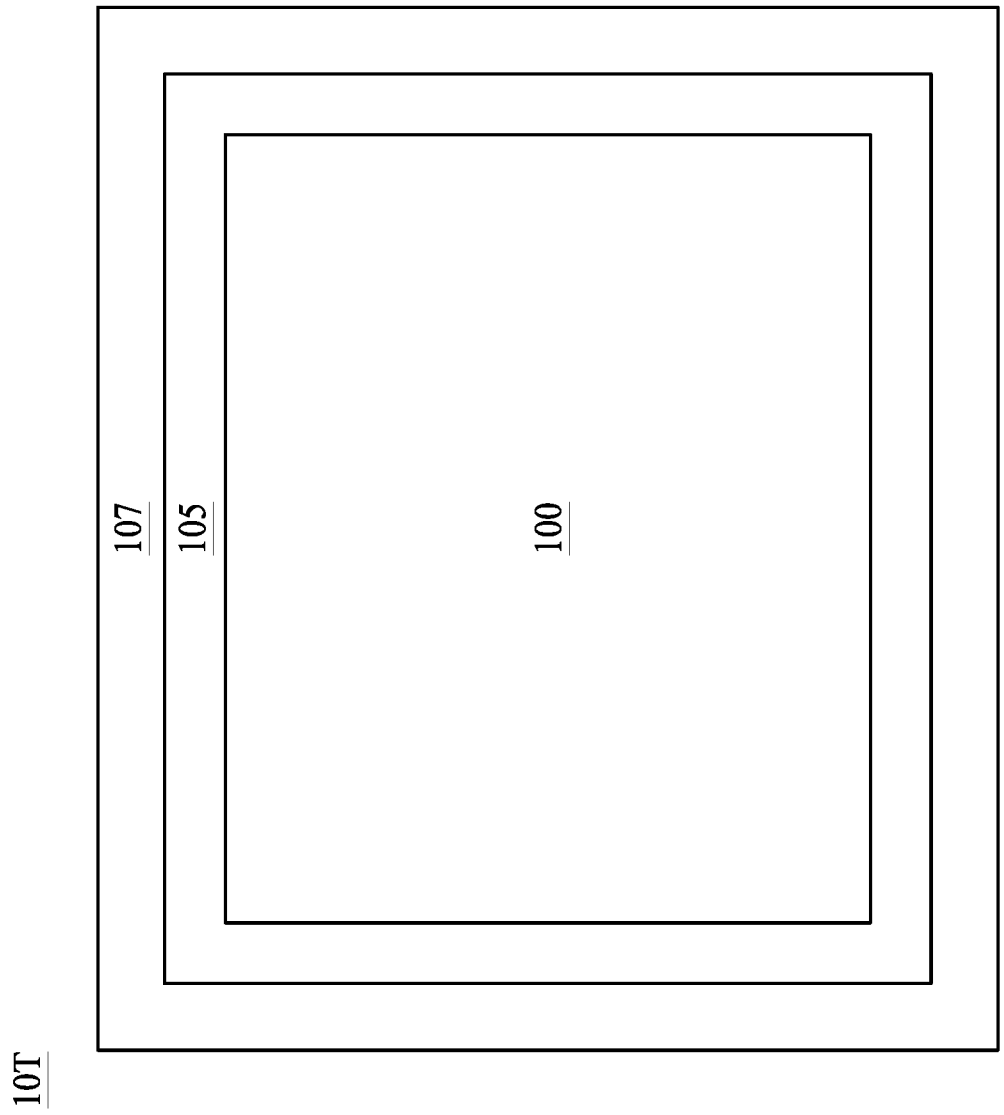
FIG. 2 illustrates a top view of the semiconductor package in FIG. 1 according to some embodiments of the present disclosure.

Referring to FIG. 2, FIG. 2 illustrates a top view 10T of the semiconductor package 10 in FIG. 1 according to some embodiments of the present disclosure. In some embodiments, when the semiconductor die 100 possesses a tetragonal layout from a top view perspective, the replacement structure 107 surrounds four sides of the semiconductor die 100 as a contiguous element, or a ring configuration, such that when die-sawing from each of the orthogonal saw streets surrounding the tetragonal semiconductor die 100, the sawing blade will interact with the replacement structure 107 having a greater modulus than that of the encapsulant 105.

Figure 3:
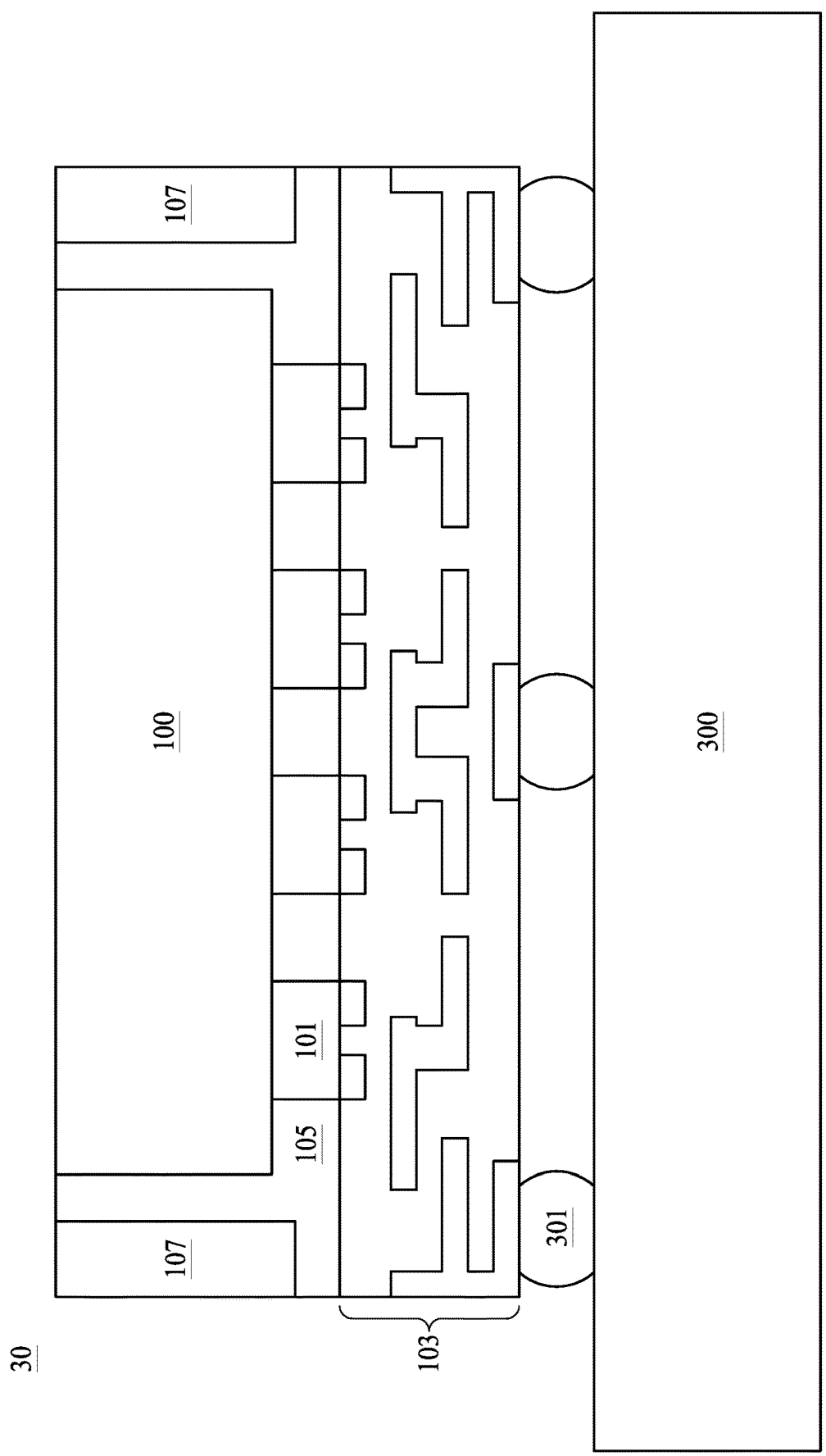
FIG. 3 illustrates a cross-sectional view of a semiconductor package according to some embodiments of the present disclosure.

Referring to FIG. 3, FIG. 3 illustrates a cross-sectional view of a semiconductor package 30 according to some embodiments of the present disclosure. The semiconductor package 30 is substantially identical to semiconductor package 10 of FIG. 1 except that a substrate 300 is further provided to electrically connect with the conductive wiring layer 103, or the fan-out RDL. In some embodiments, the conductive wiring layer 103 is connected to a top surface of the substrate 300, for example, a printed circuit board, through a solder bump 301. In some embodiments, the conductive wiring layer 103 or the fan-out RDL has a thickness of about 30 μm. In some embodiments, the semiconductor package 30 is a fan-out chip-on-substrate (FO-COS) package.

Figure 4:
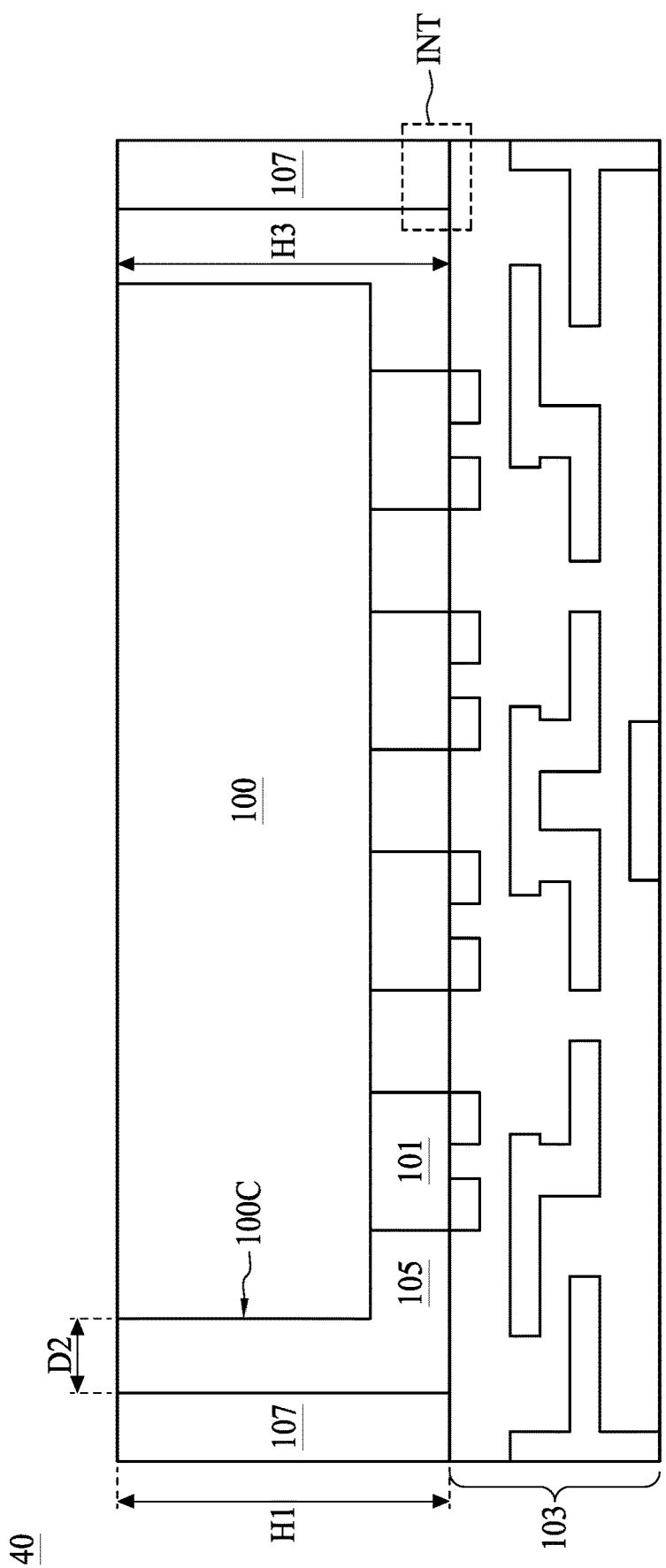
FIG. 4 illustrates a cross-sectional view of a semiconductor package according to some embodiments of the present disclosure.

Referring to FIG. 4, FIG. 4 illustrates a cross-sectional view of a semiconductor package 40 according to some embodiments of the present disclosure. The semiconductor package 40 is substantially identical to semiconductor package 10 of FIG. 1 except that the replacement structure 107 has a height H1 substantially identical to a height H3 of the encapsulant 105. In some embodiments, the height H3 of the encapsulant 105 is about 100 μm. Moreover, the distance D2 between the side surface 100C of the semiconductor die 100 and the side surface of the replacement structure 107 is greater than the distance D1 illustrated in FIG. 1. As described earlier, the volume (e.g., the height and the width) of the replacement structure 107 is determined in consideration of modulus of the replacement structure 107, modulus of the encapsulant 105, modulus of the conductive wiring layer 103, and the respective volumes suitable for preventing package warpage after package thinning operation. Once the aforesaid criteria are met, the height and the width of the replacement structure 107 can be modified accordingly. In some embodiments, the distance D2 is in a range of from about 3 μm to about 10 μm. Even if the height H1 appears to be substantially identical to a height H3, an interface INT at least partially filling with encapsulant 105 can be observed between the end of the replacement structure 107 proximal to the conductive wiring layer 103 and the top surface of the conductive wiring layer 103 receiving such end of the replacement structure 107 because the replacement structure 107 is integrated to the semiconductor package 40 through a molding operation transferring the replacement structure 107 from another carrier to the space between adjacent semiconductor dies 100.

FIG. 5 illustrates a cross-sectional view of a semiconductor package 50 according to some embodiments of the present disclosure. The semiconductor package 50 is substantially identical to semiconductor package 10 of FIG. 1 except that the replacement structure 107 has a wider end 107W proximal to the first surface 100A of the semiconductor die 100 and an opposite, narrower end 107N proximal to the second surface 100B of the semiconductor die 100. In some embodiments, mold chase is designed to create a recess in the encapsulant surrounding a semiconductor die. After demolding operation, paraffin wax can be detected at the sidewall and bottom of the recess as a result of facilitating the demolding operation. Moreover, in the comparative embodiments, the shape of the recess may have a wider top and narrower bottom for the sake of easier detaching the mold chase from the encapsulant. In present embodiments, the replacement structure 107 partially encapsulated by the encapsulant 105 is having a wider end 107W at the top and a narrower end 107N at the bottom, and no paraffin can be detected at the boundary between the replacement structure 107 and the encapsulant 105. Referring to FIG. 10A to FIG. 10L of the present disclosure, the replacement structure 107 is integrated to the semiconductor package 50 through a molding operation transferring the replacement structure 107 from another carrier to the space between adjacent semiconductor dies 100, which is a different approach compared to the aforesaid comparative embodiment where the mold chase with a particular shape is utilized to create a recess in the encapsulant, and subsequently filling heterogeneous materials into such recess.

Figure 6:
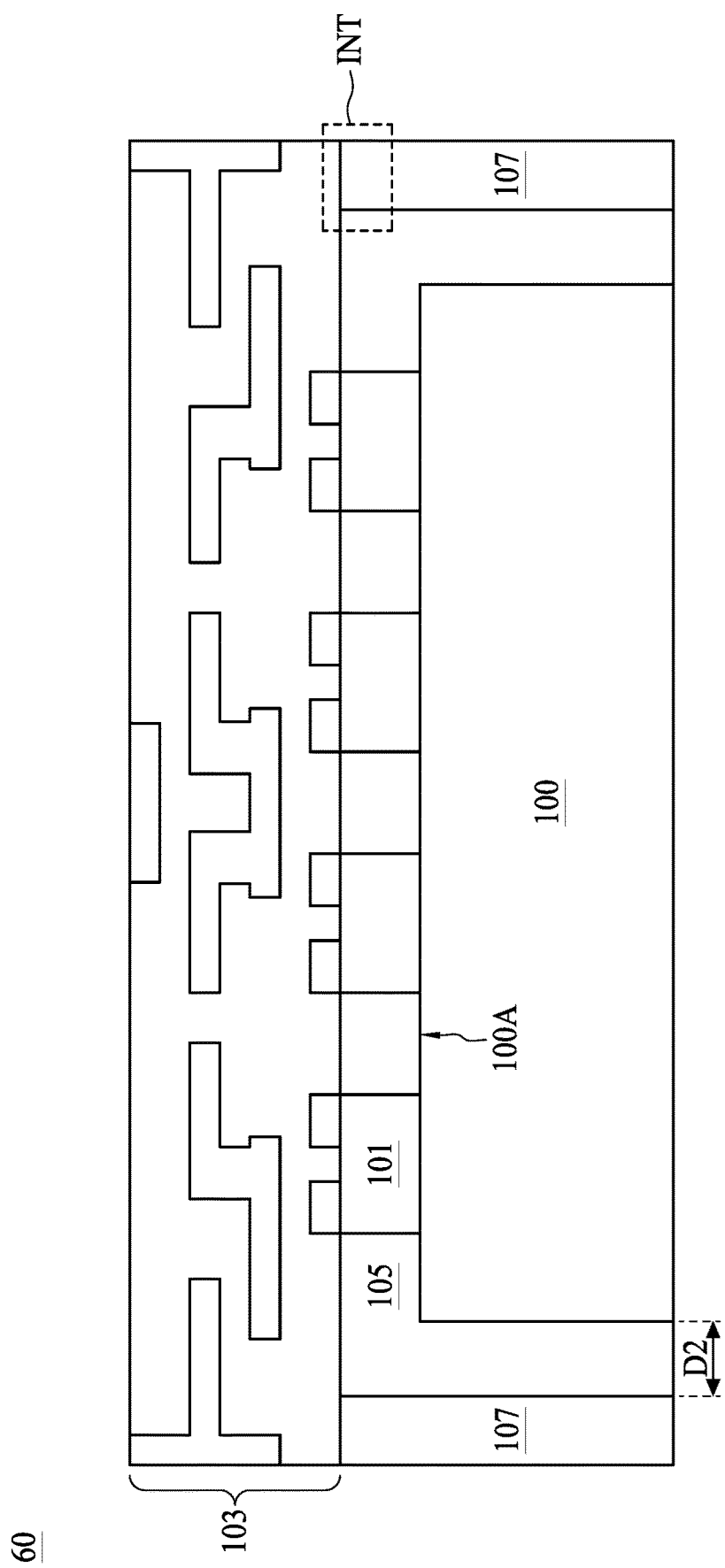
FIG. 6 illustrates a cross-sectional view of a semiconductor package according to some embodiments of the present disclosure.

FIG. 6 illustrates a cross-sectional view of a semiconductor package 60 according to some embodiments of the present disclosure. The semiconductor package 60 is substantially identical to semiconductor package 40 of FIG. 4 except that the semiconductor package 60 is manufactured by a chip-first operation. As will be described in FIG. 10A to FIG. 10L, the semiconductor package 10 is manufactured by a chip-last operation where the conductive wiring layer 103 is formed prior to the disposal of the semiconductor die 100. In a chip-first operation, the semiconductor die 100 is disposed on a carrier prior to building up the conductive wiring layer 103 over the carrier and the disposed semiconductor die 100. As shown in FIG. 6, the semiconductor die 100, the replacement structure 107, and the encapsulant 105 are disposed on a carrier which will be subsequently removed (not shown in FIG. 6). A planarization operation may be conducted to obtain a coplanar surface among the conductive element 101 of the semiconductor die 100, the replacement structure 107, and the encapsulant 105. The conductive wiring layer 103, or the RDL, is building up over the coplanar surface. The interface INT between the end of the replacement structure 107 proximal to the conductive wiring layer 103 and the surface of the conductive wiring layer 103 receiving such end of the replacement structure 107 is not filled with the encapsulant 105 because the conductive wiring layer 103 is building up on the coplanar surface of the conductive element 101, the replacement structure 107, and the encapsulant 105.

Figure 7:
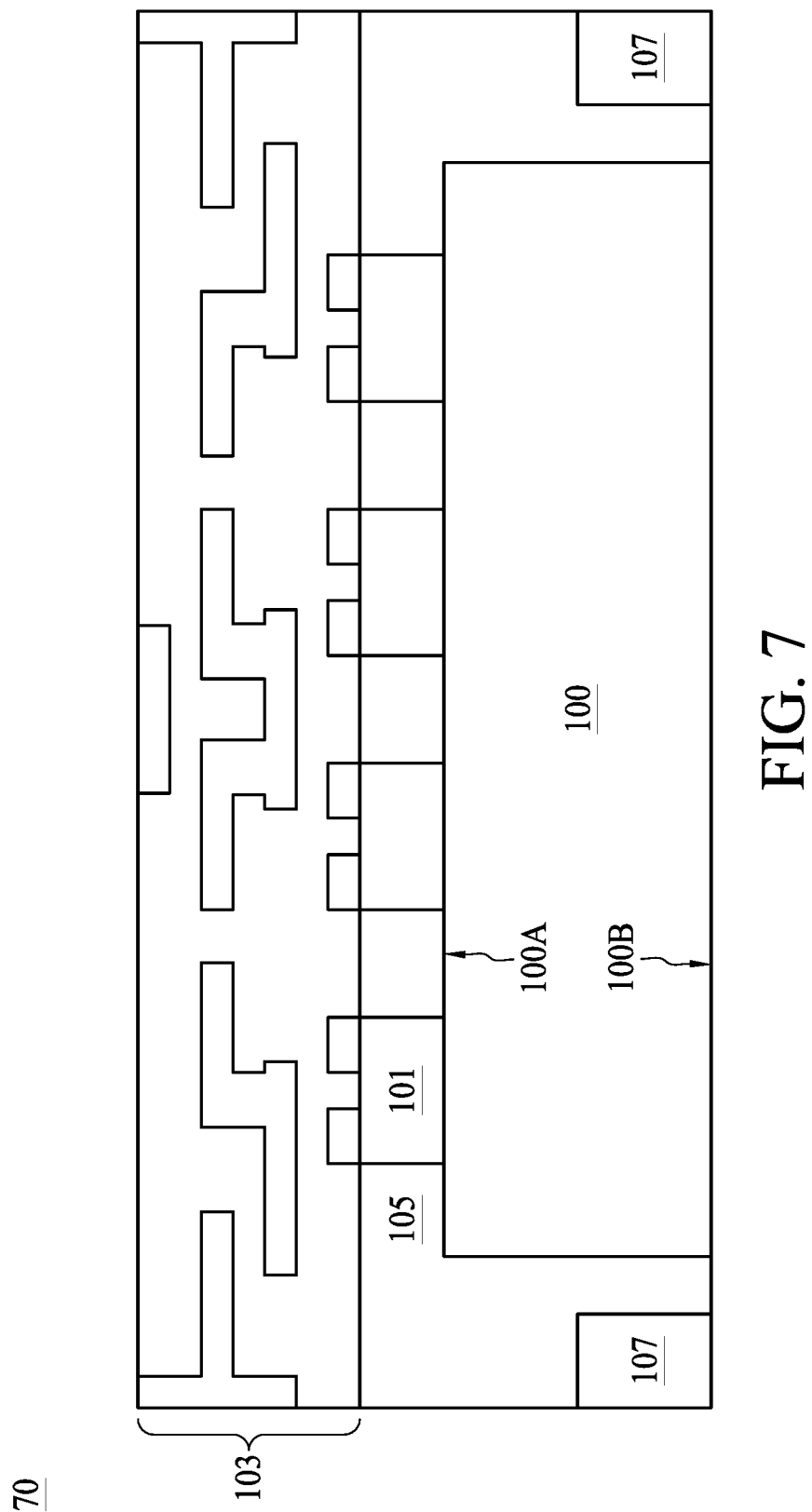
FIG. 7 illustrates a cross-sectional view of a semiconductor package according to some embodiments of the present disclosure.

FIG. 7 illustrates a cross-sectional view of a semiconductor package 70 according to some embodiments of the present disclosure. The semiconductor package 70 is substantially identical to semiconductor package 10 of FIG. 1 except that the semiconductor package 70 is manufactured by a chip-first, active side face-up operation and the replacement structure 107 is shorter than the height of the semiconductor die 100. Chip-first operation is described in FIG. 6 and can be referred thereto. As shown in FIG. 7, the second surface 100B of the semiconductor die 100, the replacement structure 107, and the encapsulant 105 are disposed on a carrier which will be subsequently removed (not shown in FIG. 7). A planarization operation may be conducted to obtain a coplanar surface among the conductive element 101 of the semiconductor die 100, the replacement structure 107, and the encapsulant 105. The conductive wiring layer 103, or the RDL, is building up over the coplanar surface. The interface between the end of the replacement structure 107 and the encapsulant 105 is away from the first surface 100A, or the active surface, of the semiconductor die 100, in order to prevent crack propagation toward the active surface during die sawing operation, as previously described in FIG. 1.

Figure 8:
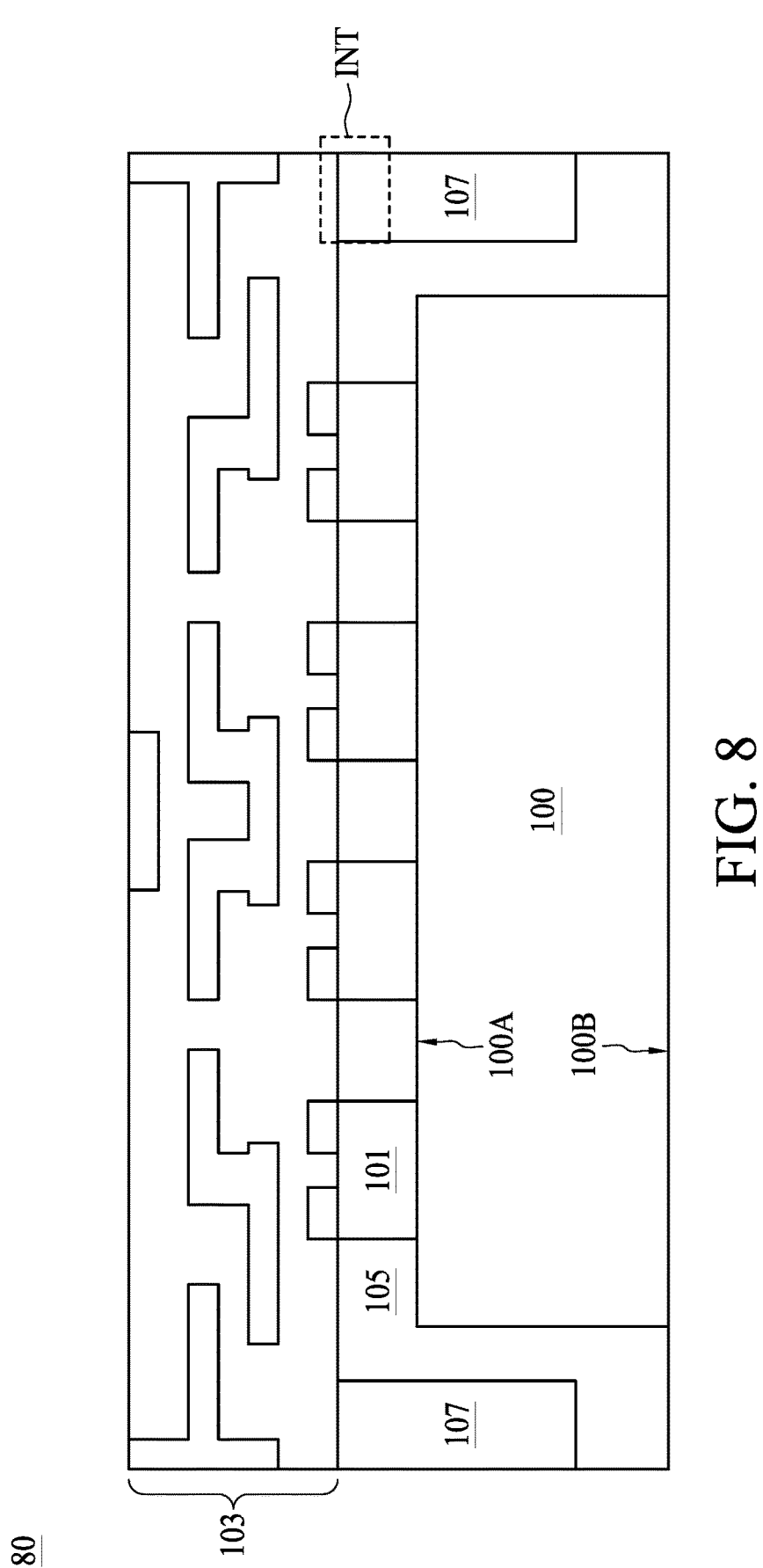
FIG. 8 illustrates a cross-sectional view of a semiconductor package according to some embodiments of the present disclosure.

FIG. 8 illustrates a cross-sectional view of a semiconductor package 80 according to some embodiments of the present disclosure. The semiconductor package 80 is substantially identical to semiconductor package 10 of FIG. 1 except that the semiconductor package 80 is manufactured by a chip-first, active side face-down operation and the replacement structure 107 is shorter than the height of the semiconductor die 100. Chip-first operation is described in FIG. 6 and can be referred thereto. As shown in FIG. 8, conductive elements 101 on the first surface 100A of the semiconductor die 100, the replacement structure 107, and the encapsulant 105 are disposed on a carrier which will be subsequently removed (not shown in FIG. 8). Detaching of the carrier exposes a coplanar surface among the conductive element 101 of the semiconductor die 100, the replacement structure 107, and the encapsulant 105. The conductive wiring layer 103, or the RDL, is building up over the coplanar surface. The interface INT between the end of the replacement structure 107 proximal to the conductive wiring layer 103 and the surface of the conductive wiring layer 103 receiving such end of the replacement structure 107 is not filled with the encapsulant 105 because the conductive wiring layer 103 is building up on the coplanar surface of the conductive element 101, the replacement structure 107, and the encapsulant 105.

Figure 9C:
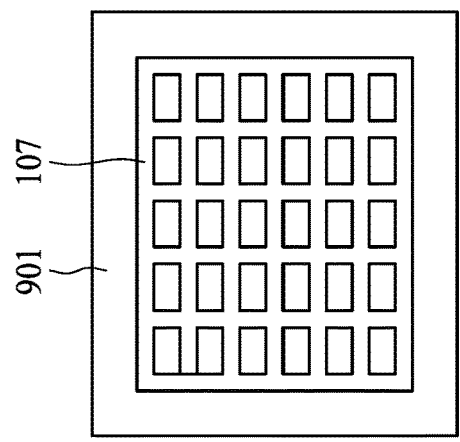
FIG. 9A, FIG. 9B, and FIG. 9C illustrate cross sectional views of intermediate products during various manufacturing operations of a semiconductor package according to some embodiments of the present disclosure.
Figure 9C:
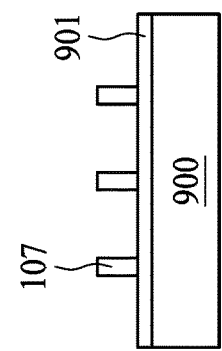
Figure 9B:
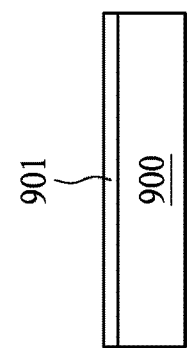
Figure 9A:
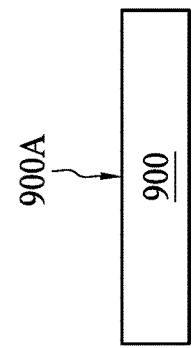

FIG. 9A to FIG. 9C illustrate cross sectional views of intermediate products during various manufacturing operations of a semiconductor package according to some embodiments of the present disclosure. In FIG. 9A, a first dummy carrier 900 having a first surface 900A is provided. In FIG. 9B, a release film 901 is disposed on the first surface 900A. In FIG. 9C, a replacement structure 107 is disposed over the first surface 900A and in contact with the release film. From a cross sectional perspective, the replacement structure 107 may have a columnar shape with uniform width. Each of the replacement structures 107 can be equally spaced to the adjacent replacement structure 107. However, the replacement structure 107 may be a contiguous element from top view perspective. As illustrated from a top view perspective in FIG. 9C', the replacement structure 107 possesses a grating layout, each of the gratings is configured to surround a semiconductor die to be disposed therein.

Figure 10A:
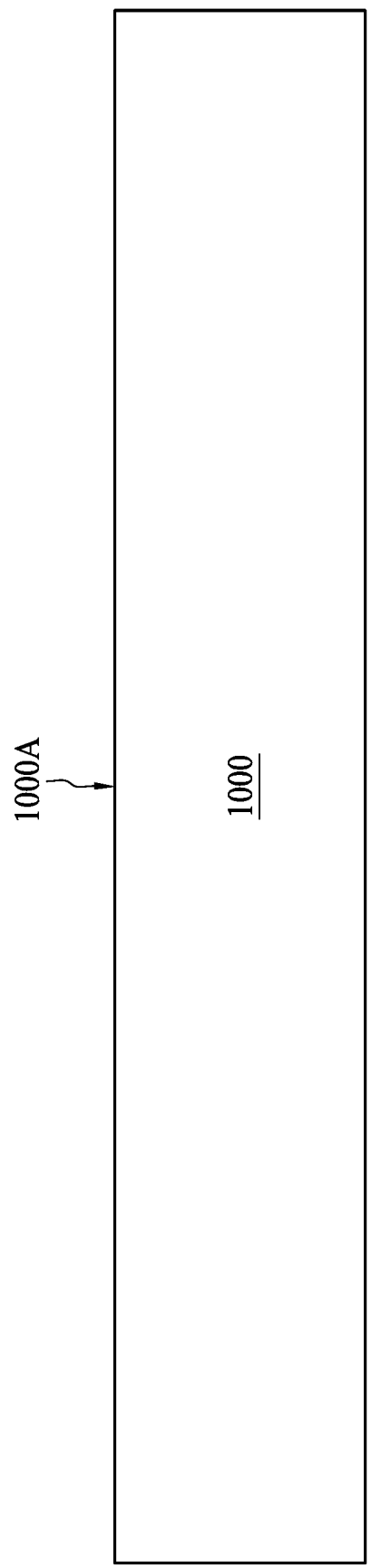
FIG. 10A, FIG. 10B, FIG. 10C, FIG. 10D, FIG. 10E, FIG. 10F, FIG. 10G, FIG. 10H, FIG. 10I, FIG. 10J, FIG. 10K, and FIG. 10L illustrate cross sectional views of intermediate products during various manufacturing operations of a semiconductor package according to some embodiments of the present disclosure.
Figure 10B:
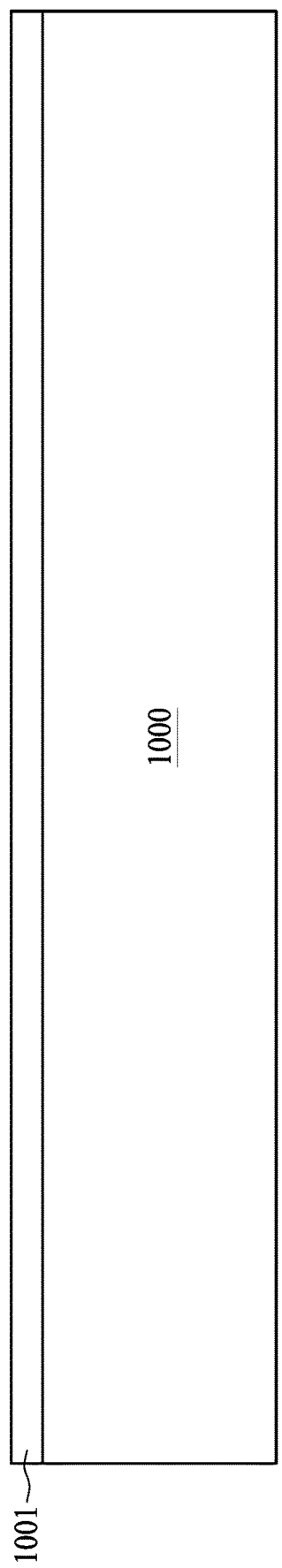
Figure 10C:
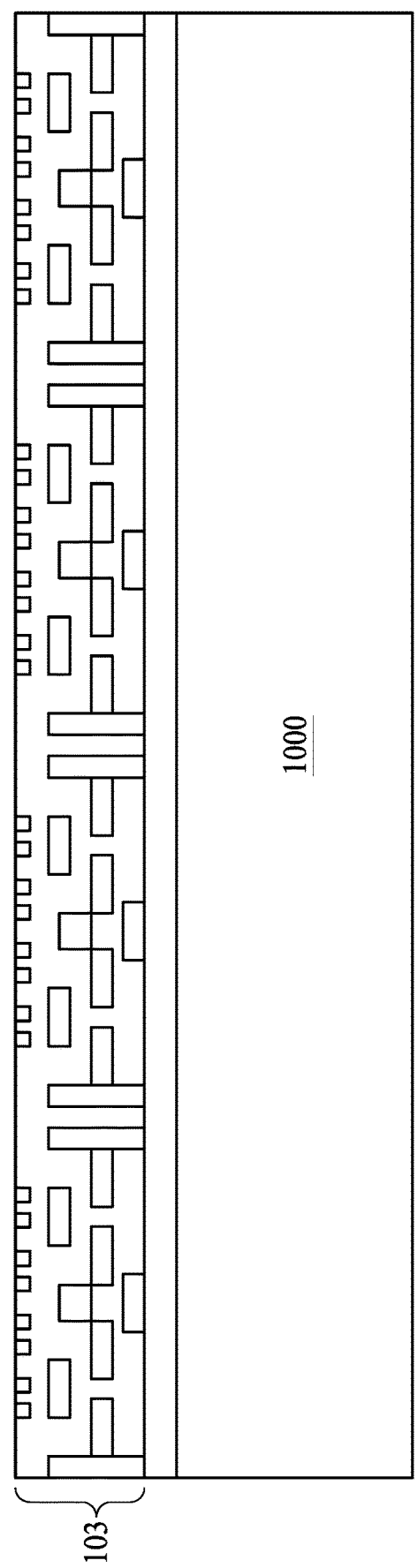
Figure 10D:
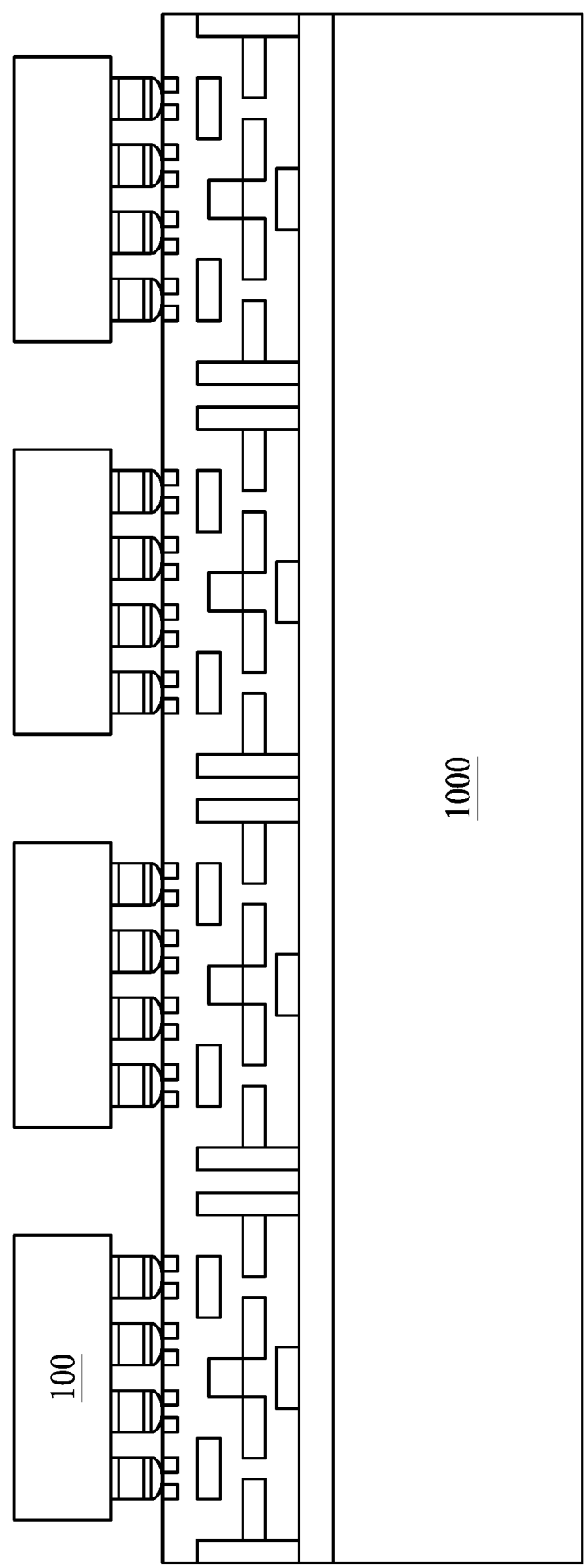
Figure 10E:
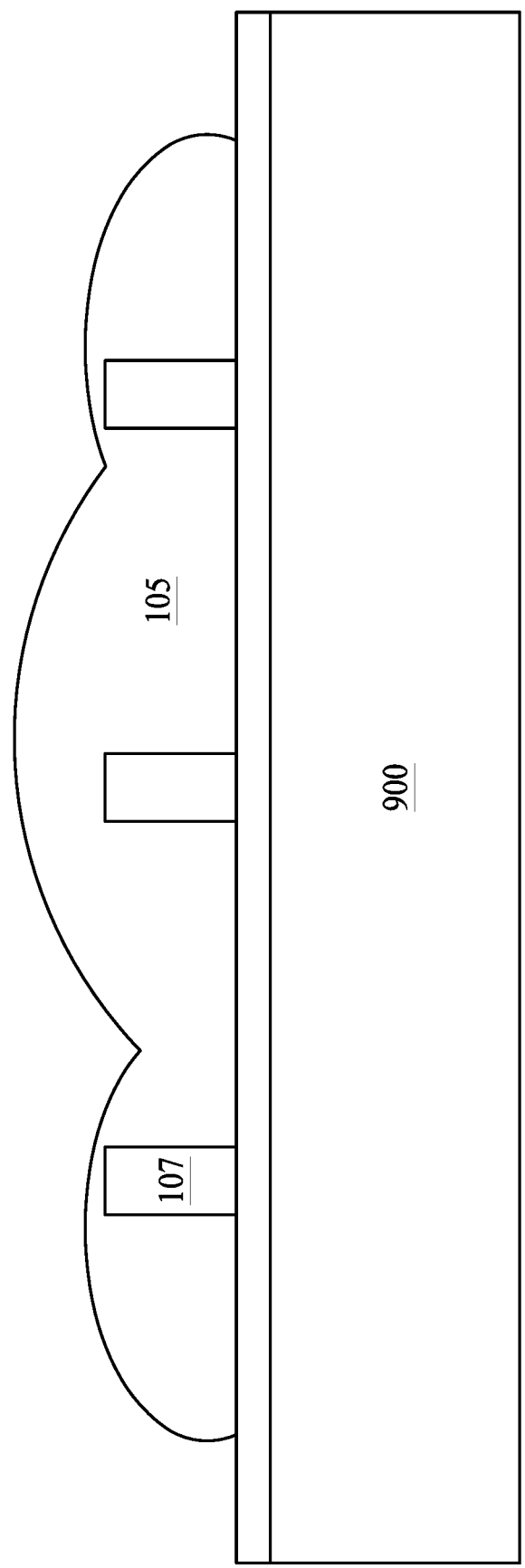
Figure 10F:
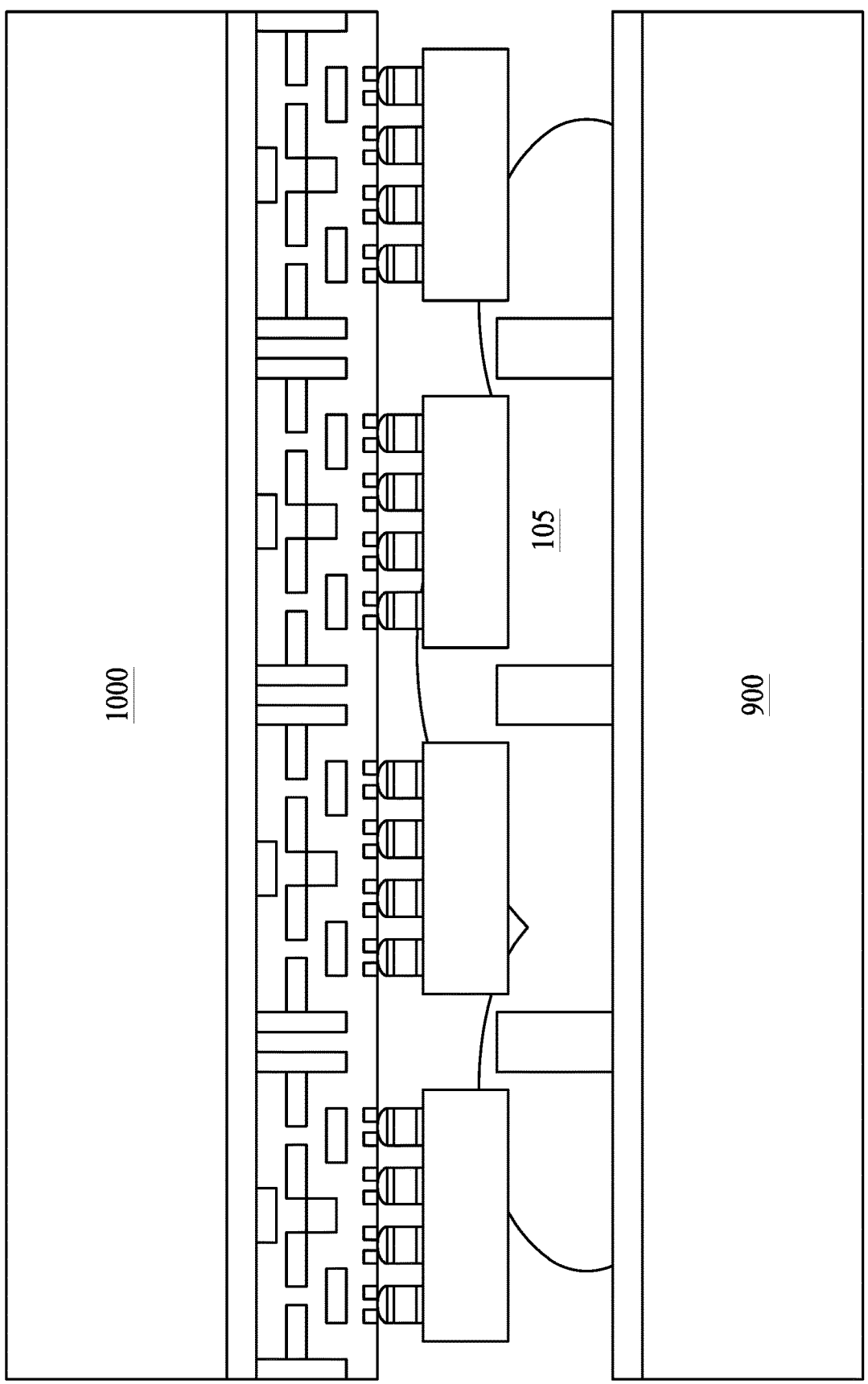
Figure 10G:
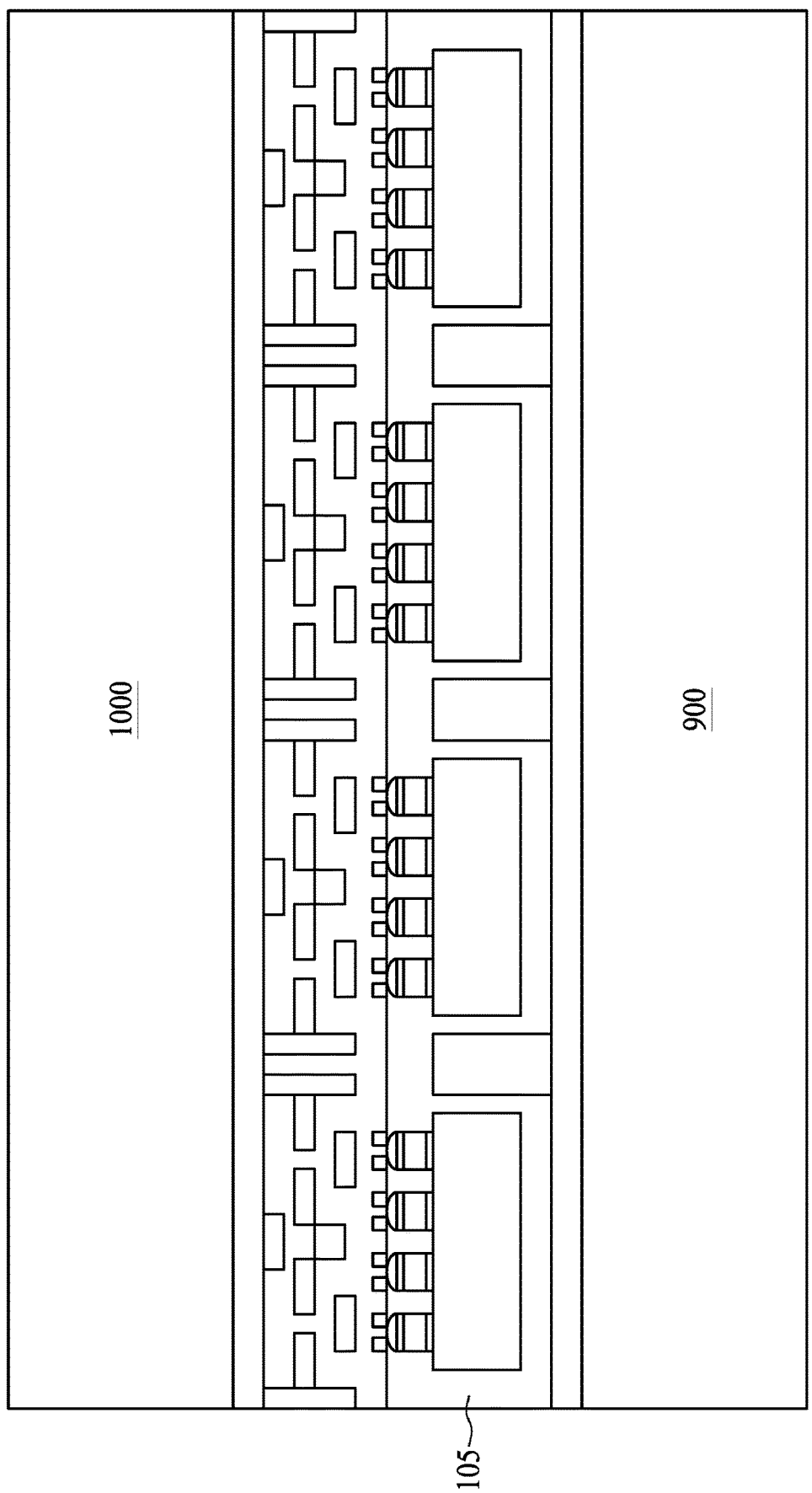
Figure 10H:
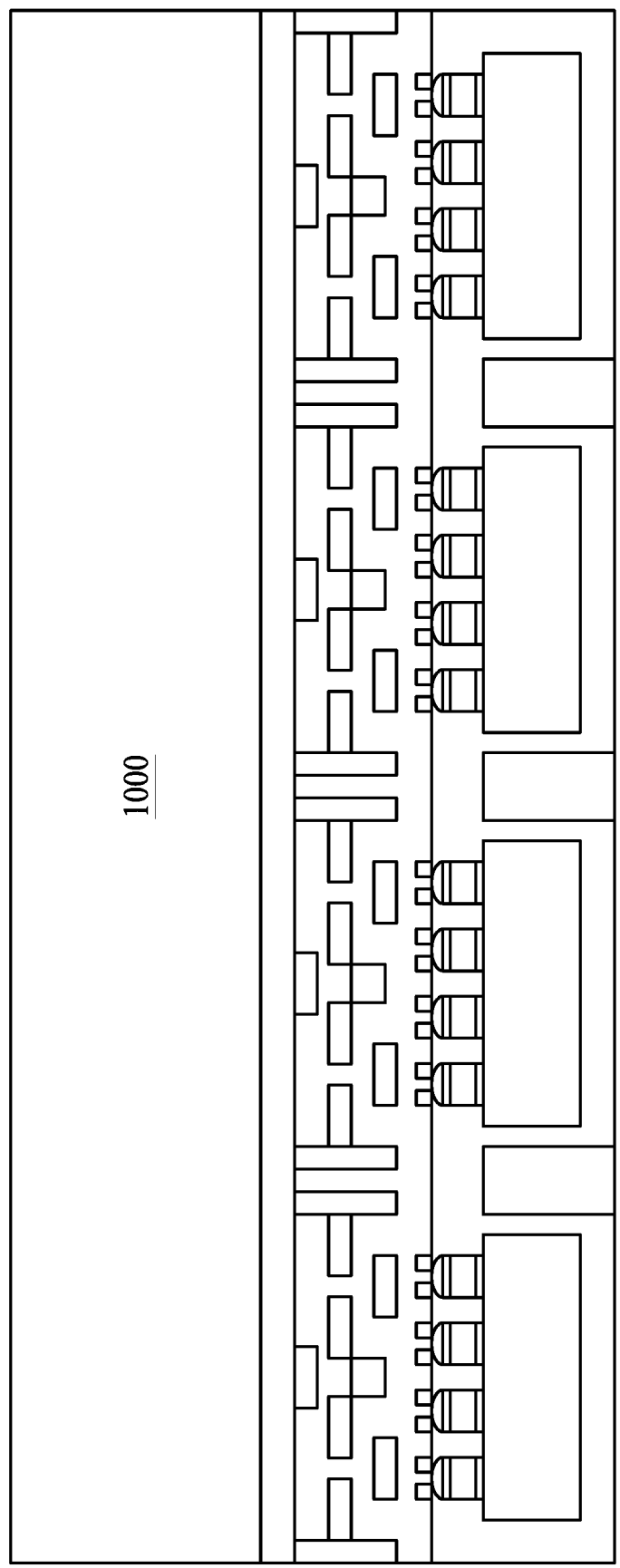
Figure 10I:
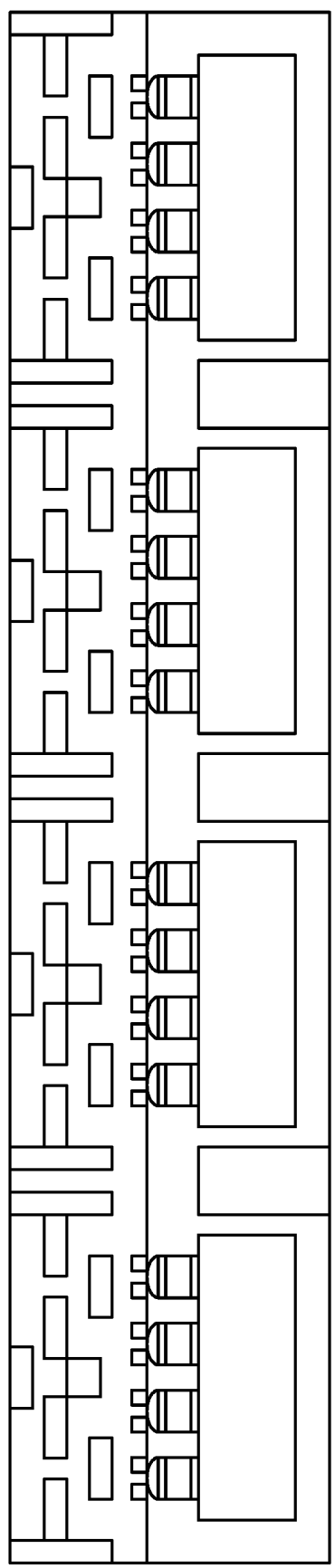
Figure 10J:
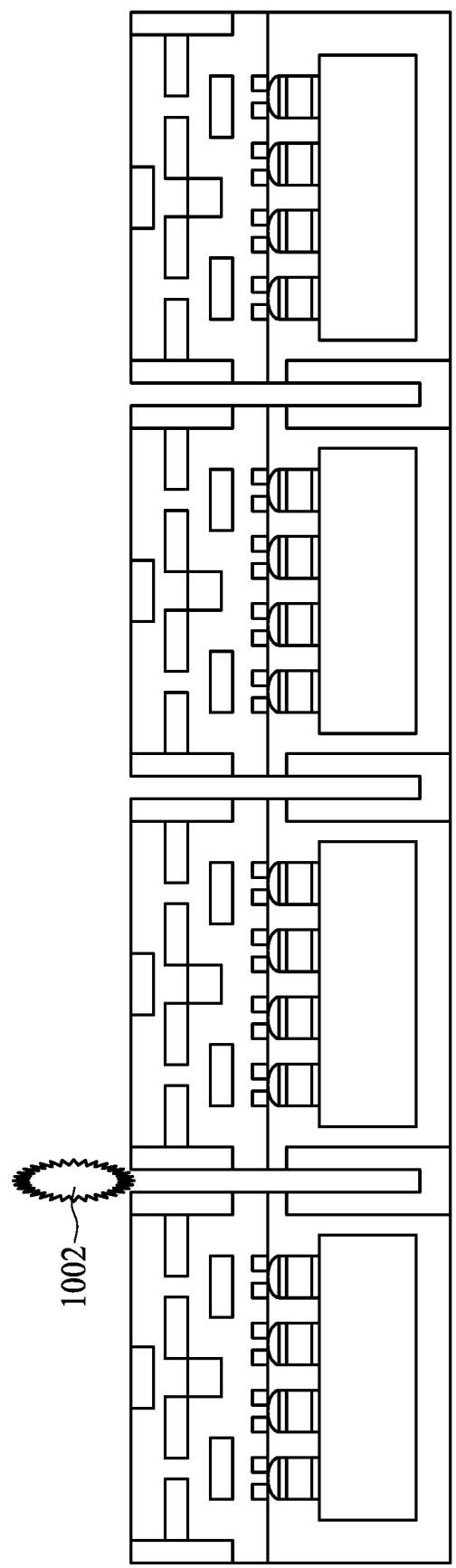
Figure 10K:
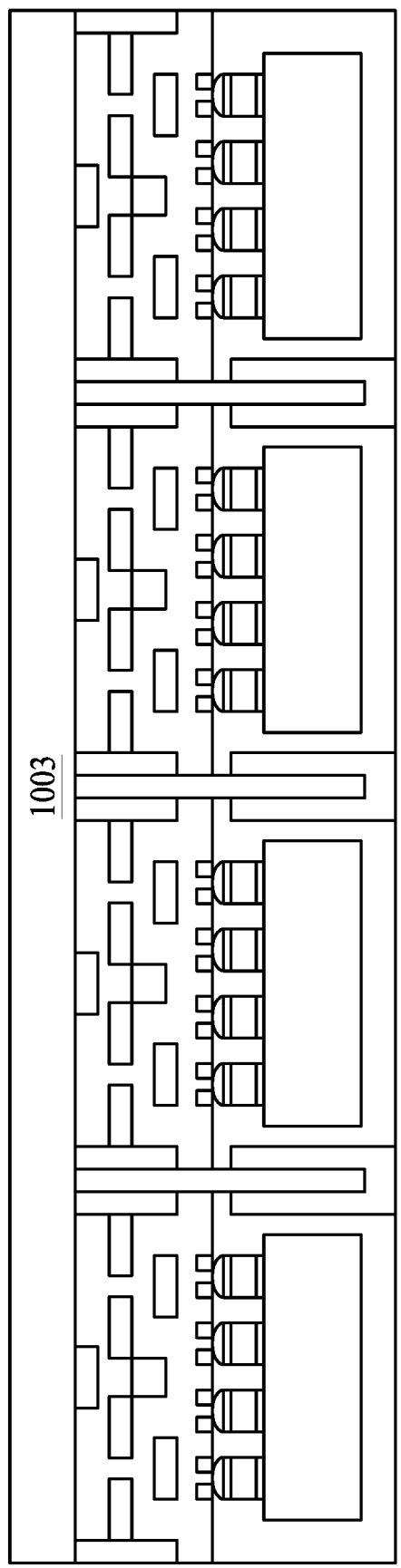
Figure 10L:
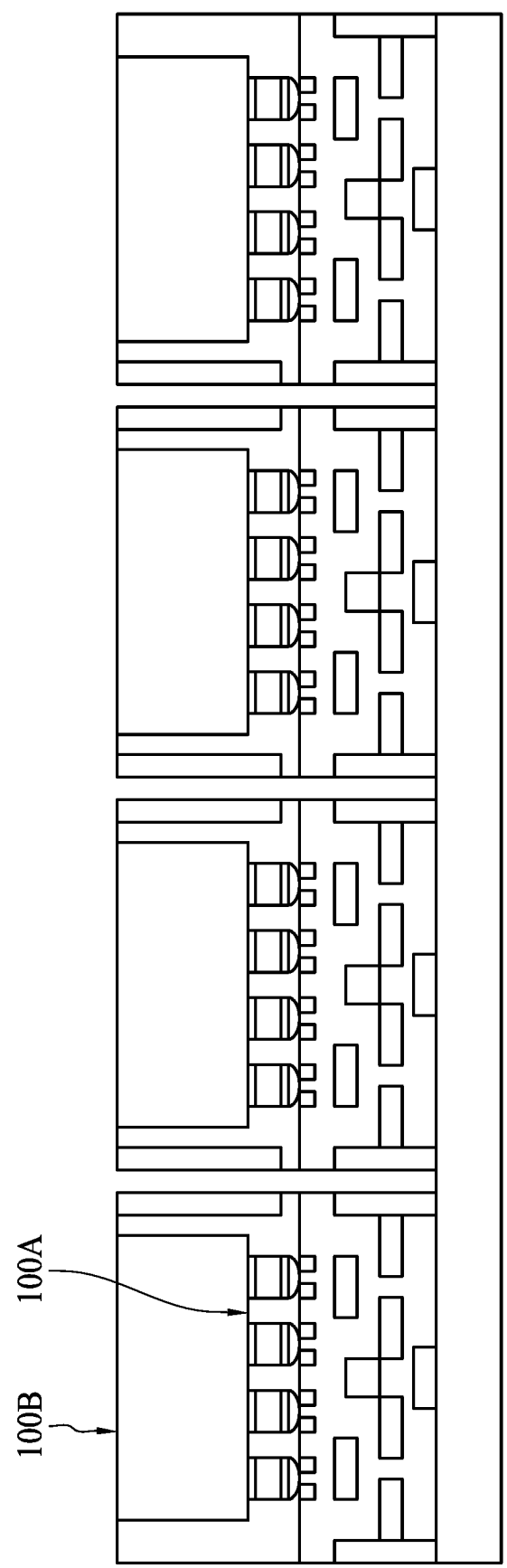

Referring FIG. 10A to FIG. 10L, FIG. 10A to FIG. 10L illustrate cross sectional views of intermediate products during various manufacturing operations of a semiconductor package according to some embodiments of the present disclosure. In FIG. 10A, a second carrier 1000 having a first surface 1000A is provided. In FIG. 10B, a release film 1001 is disposed on the first surface 1000A. In FIG. 10C, a conductive wiring layer 103, or an RDL, is built up over the first surface 1000A. As previously discussed, FIG. 10A to FIG. 10L illustrate a chip-last manufacturing sequence, therefore the conductive wiring layer 103 is formed prior to the disposal of semiconductor dies. In FIG. 10D, a plurality of semiconductor dies 100 are positioned over the second carrier 1000, and electrically connected to the conductive wiring layer 103 through, for example, a flip-chip bonding configuration. Subsequently, underfill materials is applied to surrounds the conductive contact of the semiconductor dies 100 engaging to the conductive wiring layer 103.

In FIG. 10E, encapsulant 105 is applied over the first carrier 900 disposed with the replacement structure 107. The encapsulant 105 can be molding compound filling spaces between adjacent replacement structures 107. In FIG. 10F, the first surface 900A of the first carrier 900 and the first surface 1000A of the second carrier 1000 are engaged, bonded by the encapsulant 105 previously disposed on the first surface 900A. During the bonding operation, the replacement structure 107 is aligned with a region separating adjacent semiconductor dies 10 such that after the bonding operation, each of the replacement structure 107 is separating two adjacent semiconductor dies 100. The encapsulant 105 fills the spaces between each of the replacement structure 107, the adjacent semiconductor dies 100, the conductive wiring layer 103, and the first surface 900A of the first carrier 900 after the bonding operation.

In FIG. 10H, the first carrier 900 is detached from the encapsulant 105 and the replacement structure 107 by removing the releasing film 901. In FIG. 10I, the second carrier 1000 is detached from the conductive wiring layer 103 by removing the releasing film 1001. In FIG. 10J, a singulating operation is performed to separate adjacent semiconductor dies 100 by aligning a sawing blade 1002 to the sawing mark on the conductive wiring layer 103. The sawing mark (not shown in FIG. 10J) is formed on a surface of the conductive wiring layer 103 and aligning with the each of the replacement structures 107. In some embodiments, the singulating operation is a half-cut operation where the sawing blade 102 passes through the conductive wiring layer 103, the encapsulant 105, and along a longitudinal direction of the replacement structure 107. A closed end is formed after the singulating operation because the sawing blade 1002 stops in the replacement structure 107. Alternatively stated, a portion of the replacement structure 107 proximal to the second surface 100B of the semiconductor die 100 is connected, or not separated, after the singulation operation.

In FIG. 10K, the intermediate semiconductor package as illustrated in FIG. 10J is taped to a grinding tape 1003 attached to the conductive wiring layer 103. A backside grinding operation is performed as illustrated in FIG. 10L. The encapsulant 105 proximal to the second surface 100B of the semiconductor die 100 is grinded until the second surface 100B is exposed. In some embodiments, the semiconductor die 100 is further removed from the second surface 100B to expose a fresh surface, where suitable to the die thinning goal. Moreover, the grinding operation removes the remaining, connected replacement structure 107 that holds together adjacent semiconductor dies 100 in the intermediate semiconductor package. The semiconductor dies 100 are fully singulated after the backside grinding operation, and can be picked from the grinding tape 1003 for further disposal or integration.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 within 30 within 20 within 10 or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
   a semiconductor die having a first surface and a second surface opposite to the first surface;
   a conductive wiring layer stacked with the semiconductor die and proximal to the first surface;
   an encapsulant encapsulating the semiconductor die and stacked with the conductive wiring layer; and
   a replacement structure exposing from the encapsulant and being free of fillers,
   wherein the replacement structure comprises a wider end proximal to the first surface of the semiconductor die and a narrower end proximal to the second surface of the semiconductor die.

2. The semiconductor package of claim 1, wherein the encapsulant comprises the fillers.

3. The semiconductor package of claim 1, wherein a side surface of the semiconductor die is spaced from the replacement structure by a distance of from about 3 μm to about 10 μm, the side surface connecting the first surface and the second surface.

4. The semiconductor package of claim 1, wherein a height of the replacement structure is greater than a distance between the first surface and the second surface.

5. The semiconductor package of claim 1, wherein the replacement structure surrounds four sides of the semiconductor die.

6. The semiconductor package of claim 1, wherein a height of the replacement structure is substantially identical to a height of the encapsulant.

7. The semiconductor package of claim 1, wherein the conductive wiring layer is a fan-out redistribution layer (RDL).

8. The semiconductor package of claim 7, further comprising a substrate electrically connected to the fan-out RDL.

9. The semiconductor package of claim 1, wherein the second surface, the encapsulant and the replacement structure are substantially coplanar.

10. The semiconductor package of claim 1, wherein the replacement structure has a modulus greater than that of the encapsulant.

11. The semiconductor package of claim 1, wherein the replacement structure has a first portion exposed from the encapsulant and proximal to the second surface, and a second portion exposed from the encapsulant and proximal to the conductive wiring layer, and wherein a surface roughness of the second portion is greater than a surface roughness of the first portion.

* * * * *